(12) United States Patent
El Hajjam

(10) Patent No.: US 11,985,833 B2
(45) Date of Patent: May 14, 2024

(54) THREE-DIMENSIONAL RESISTIVE RANDOM ACCESS MEMORY AND METHOD MAKING IT POSSIBLE TO OBTAIN SUCH A MEMORY

(71) Applicant: COMMISSARIAT À L'ÉNERGIE ATOMIQUE ET AUX ÉNERGIES ALTERNATIVES, Paris (FR)

(72) Inventor: Khalil El Hajjam, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 446 days.

(21) Appl. No.: 17/312,702

(22) PCT Filed: Dec. 12, 2019

(86) PCT No.: PCT/EP2019/084813
§ 371 (c)(1),
(2) Date: Jun. 10, 2021

(87) PCT Pub. No.: WO2020/120654
PCT Pub. Date: Jun. 18, 2020

(65) Prior Publication Data
US 2022/0037398 A1 Feb. 3, 2022

(30) Foreign Application Priority Data

Dec. 13, 2018 (FR) ..................... 1872842

(51) Int. Cl.
*H10B 63/00* (2023.01)
*H10N 70/00* (2023.01)
(52) U.S. Cl.
CPC ......... *H10B 63/845* (2023.02); *H10N 70/066* (2023.02); *H10N 70/8828* (2023.02); *H10N 70/8833* (2023.02)

(58) Field of Classification Search
CPC ............... H10B 63/845; H10N 70/066; H10N 70/8828; H10N 70/8833
See application file for complete search history.

(56) References Cited

U.S. PATENT DOCUMENTS

| 6,643,159 B2* | 11/2003 | Fricke | ................. | H01L 27/0688 |
| | | | | 257/E27.081 |
| 11,393,876 B2* | 7/2022 | El Hajjam | ........... | H10B 63/845 |

(Continued)

FOREIGN PATENT DOCUMENTS

FR 3 066 043 A1 11/2018

OTHER PUBLICATIONS

International Search Report as issued in International Patent Application No. PCT/EP2019/084813, dated Feb. 25, 2020.

*Primary Examiner* — Allison Bernstein
(74) *Attorney, Agent, or Firm* — Pillsbury Winthrop Shaw Pittman LLP

(57) ABSTRACT

A memory includes a memory cell including a planar electrode in a first plane; a floating electrode in a second plane, parallel to the first plane; a vertical electrode. The planar electrode includes a first part facing a first part of the floating electrode, the first part of the planar electrode and the first part of the second electrode being separated by a first layer of a first active material, the vertical electrode includes a part facing a second part of the floating electrode, the first part of the vertical electrode and the second part of the floating electrode being separated by a second layer of a second active material. The first active material forms a selector or a memory point and the second active material forms a memory point or a selector. The planar and floating electrodes not sharing any plane parallel to the first or second plane.

9 Claims, 14 Drawing Sheets

(56) References Cited

U.S. PATENT DOCUMENTS

| | | |
|---|---|---|
| 2003/0185048 A1 | 10/2003 | Fricke et al. |
| 2013/0134382 A1 | 5/2013 | Martens et al. |
| 2015/0340406 A1* | 11/2015 | Jo ........................ H10N 70/841 257/4 |
| 2017/0141161 A1 | 5/2017 | Sakotsubo et al. |

* cited by examiner

[Figure 1A]
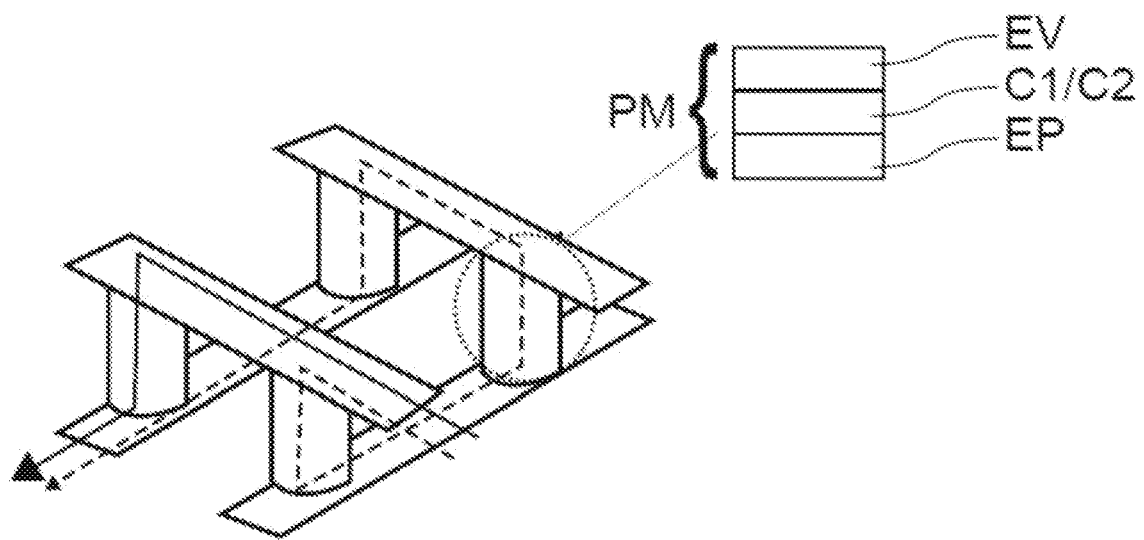
[Figure 1B]
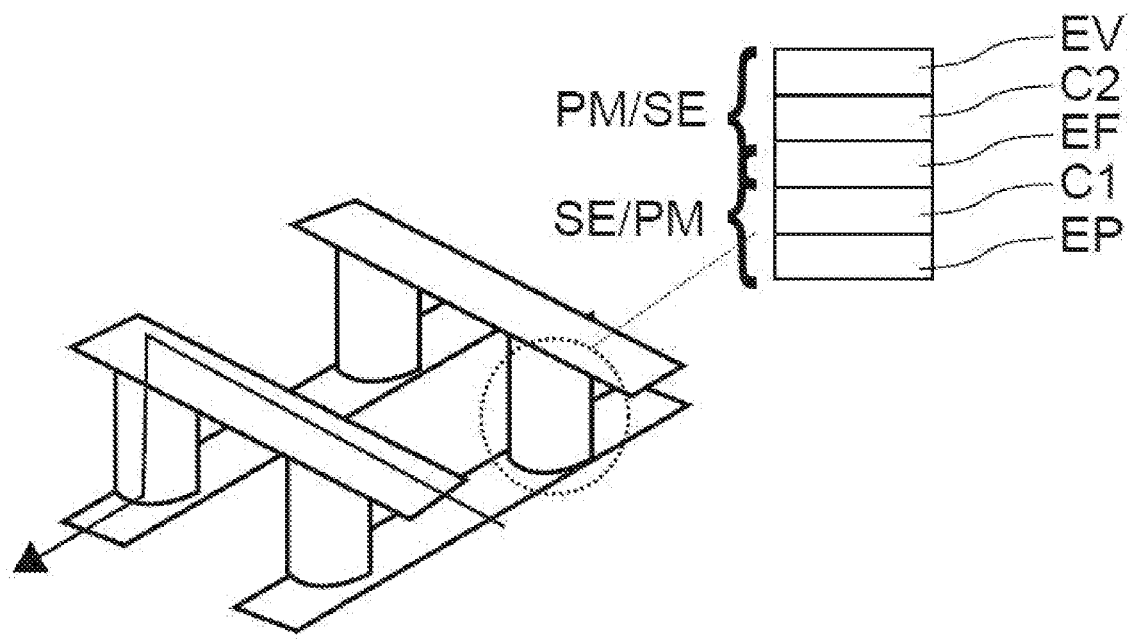

[FIG 2A]
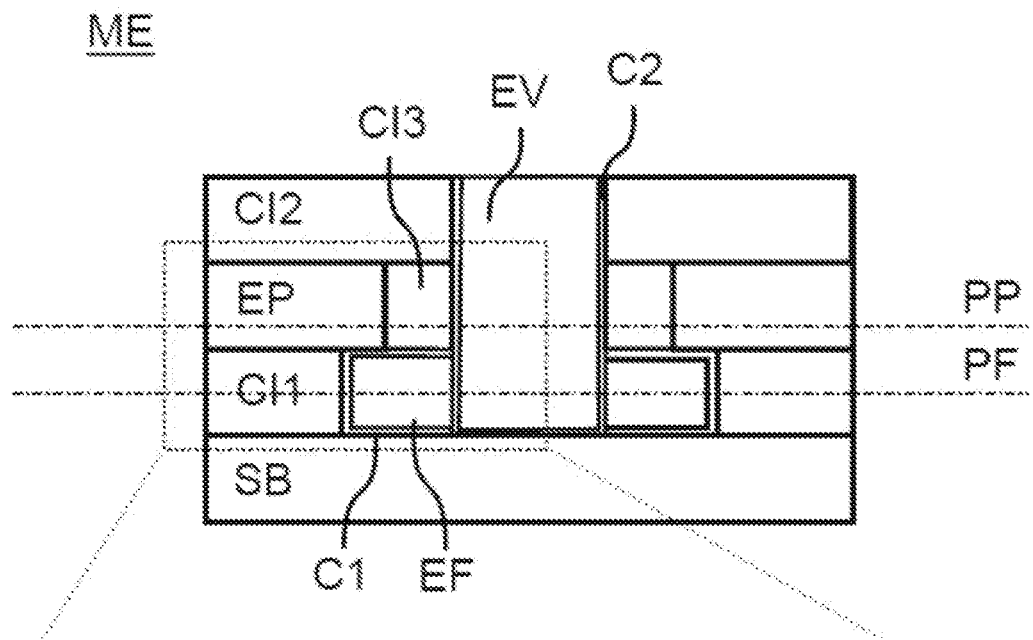

[Figure 2B]
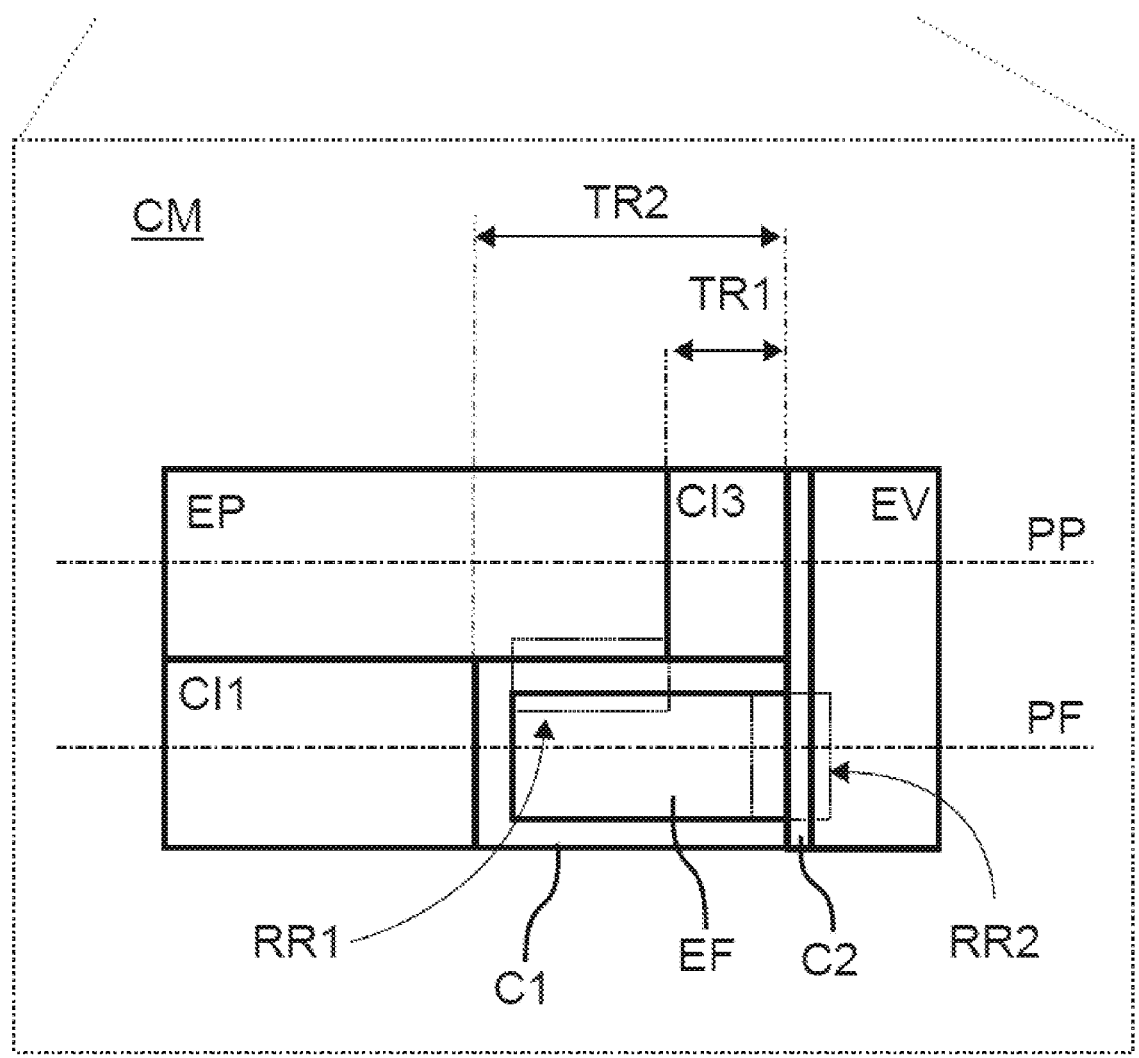

[FIG 3]
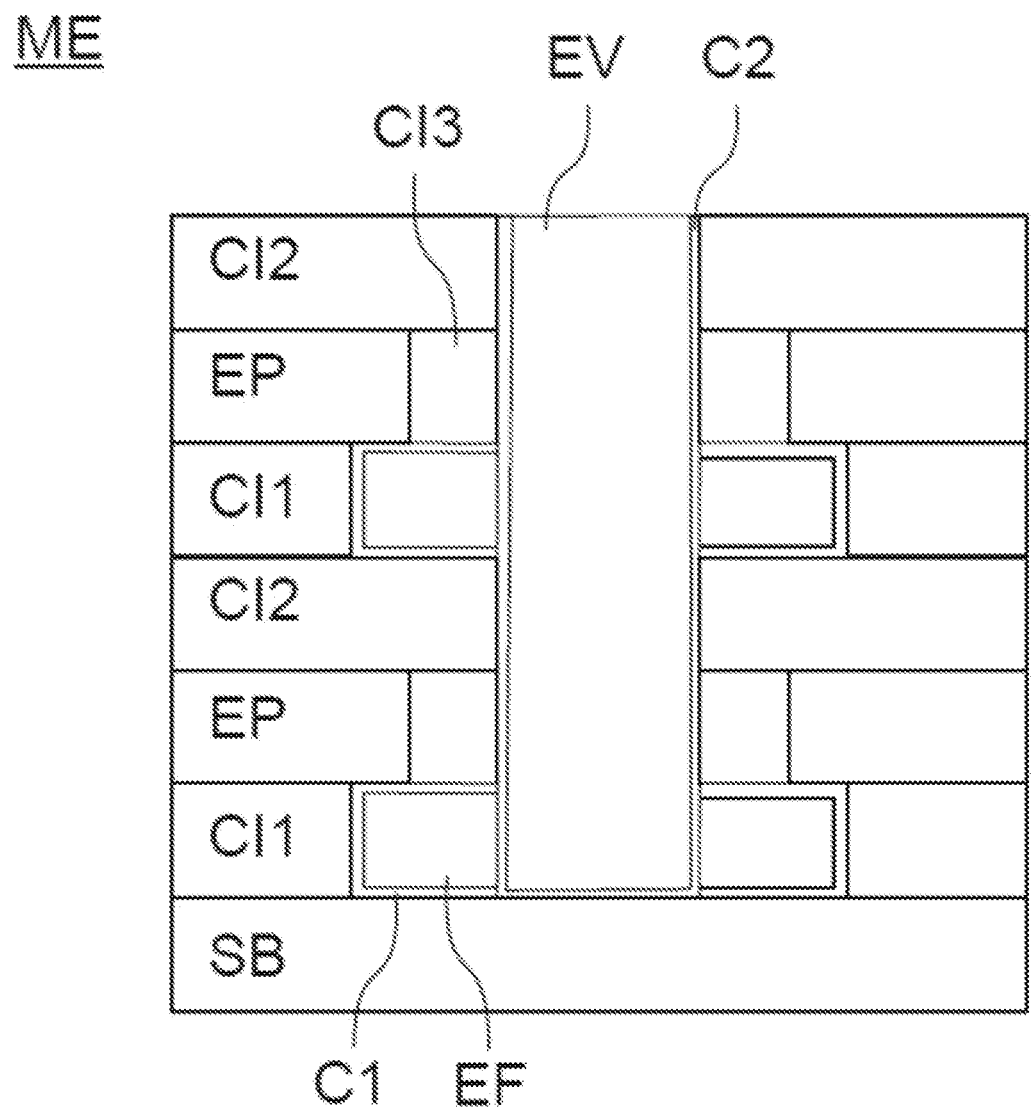

[Figure 4A]
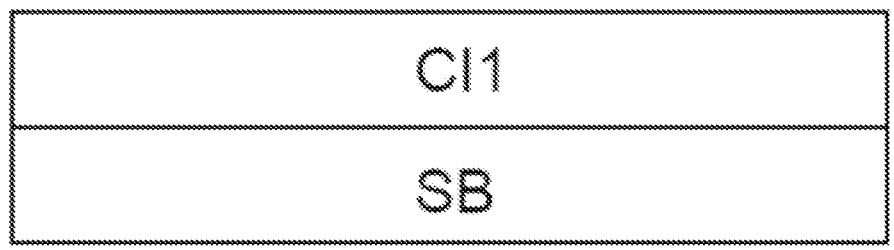
[Figure 4B]
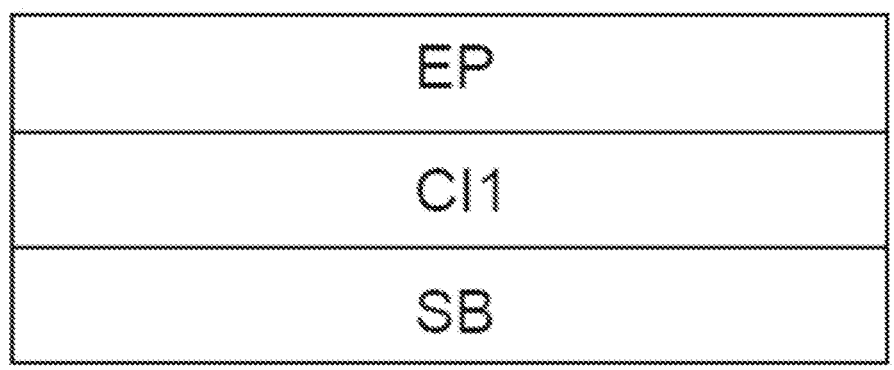
[Figure 4C]
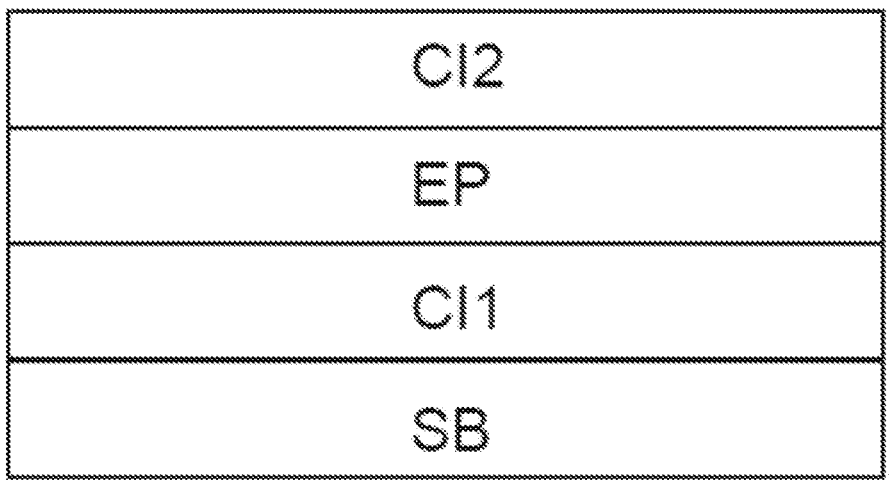

[FIG 4D]
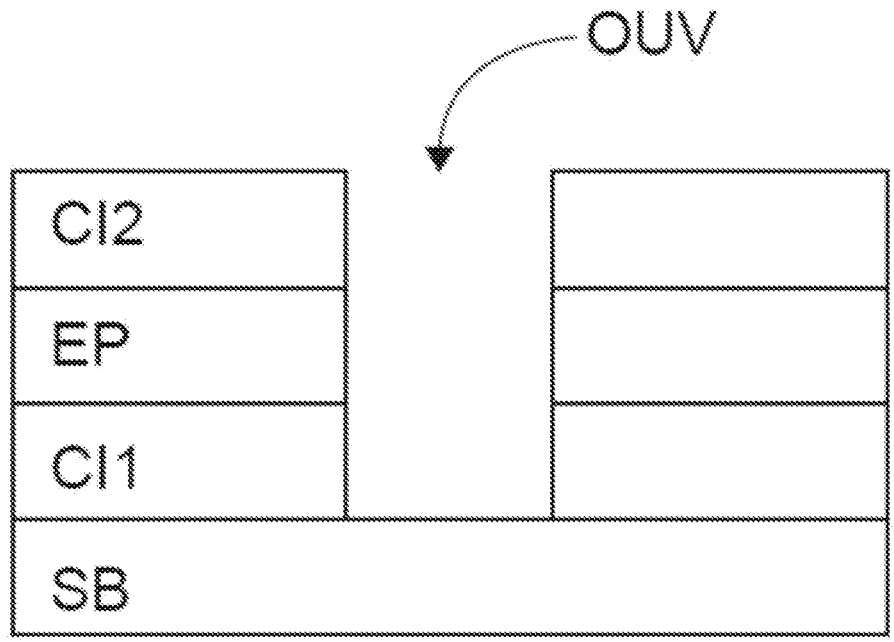
[Figure 4E]
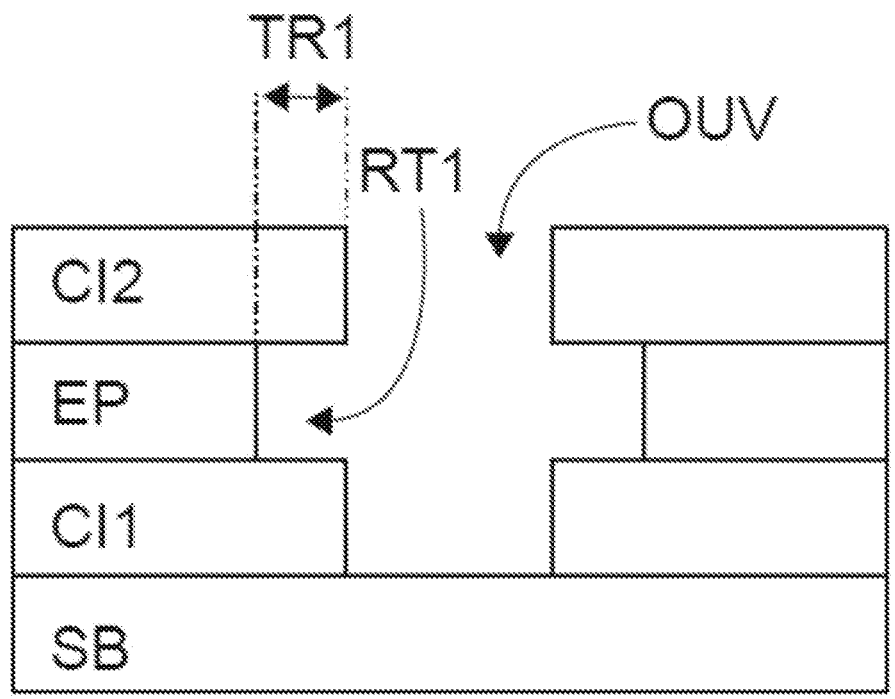

[Figure 4F]
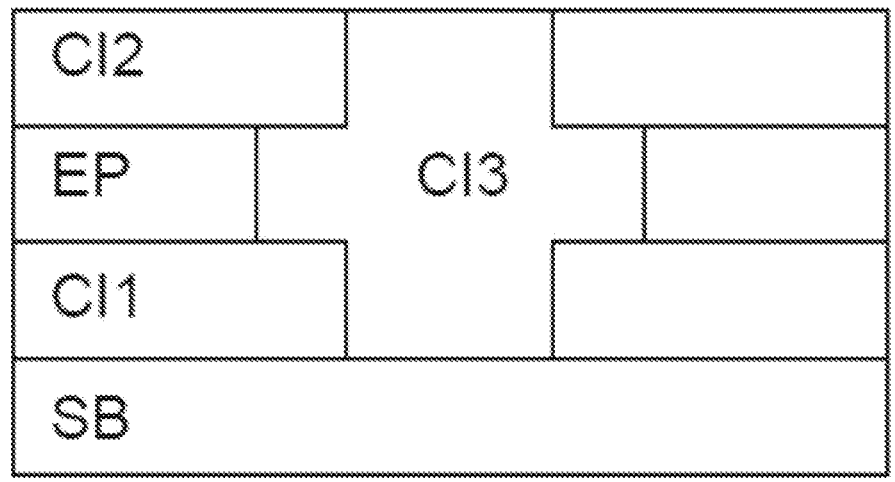
[Figure 4G]
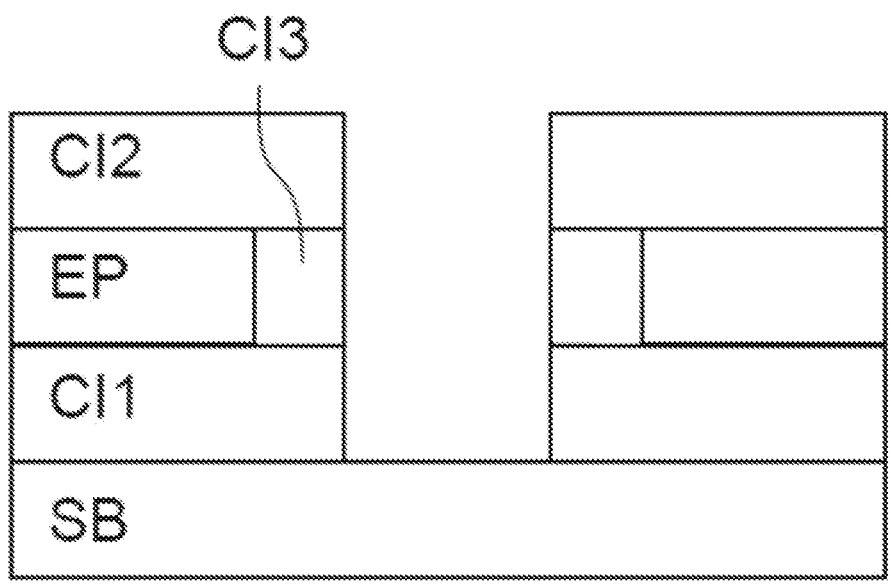

[Figure 4H]
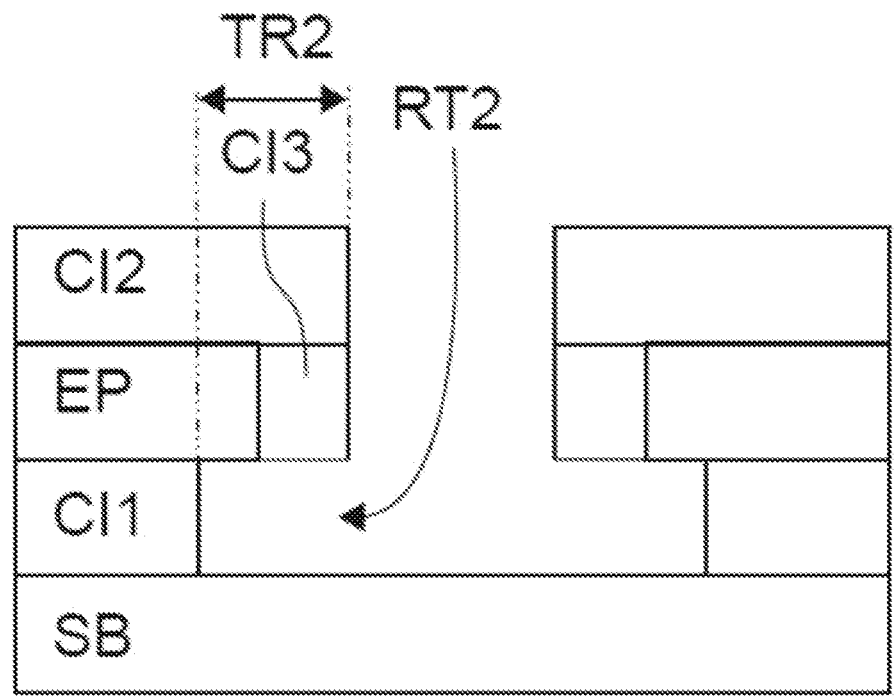
[Figure 4I]
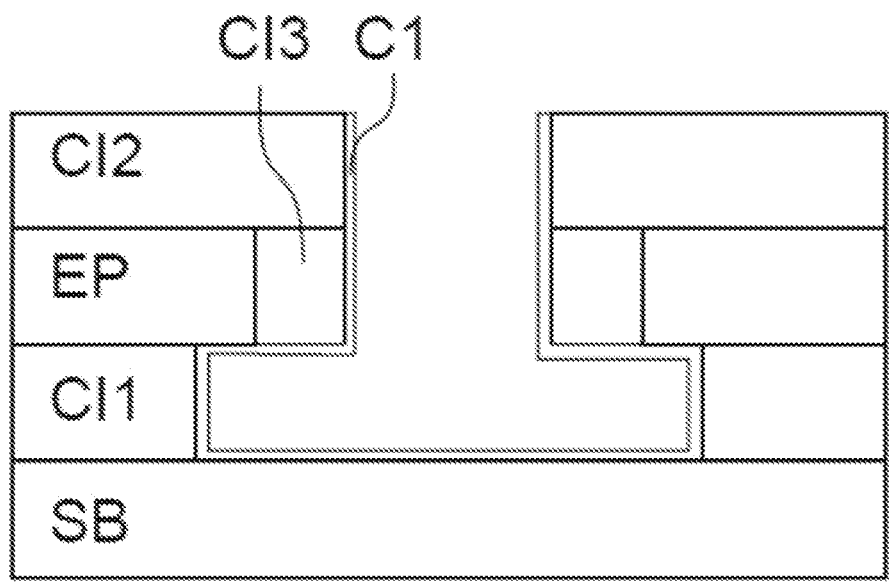

[Figure 4J]
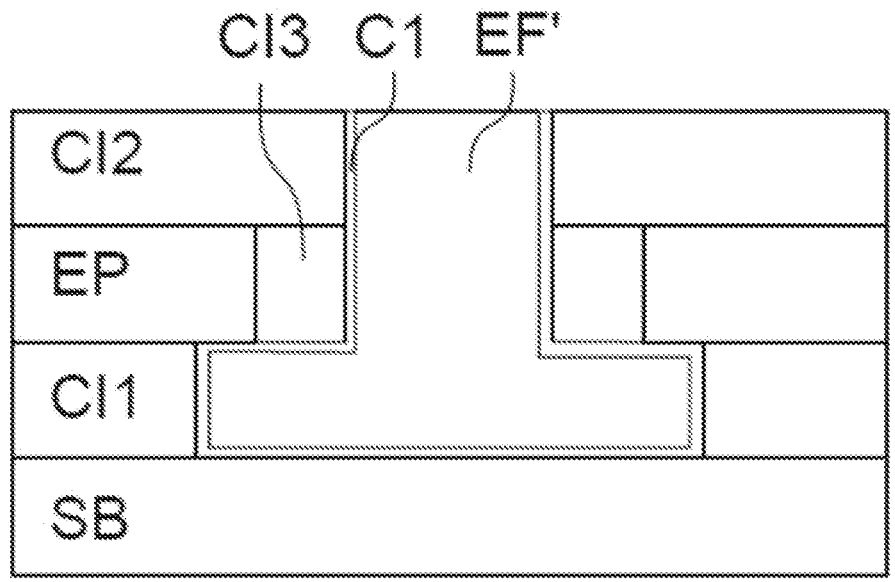
[Figure 4K]
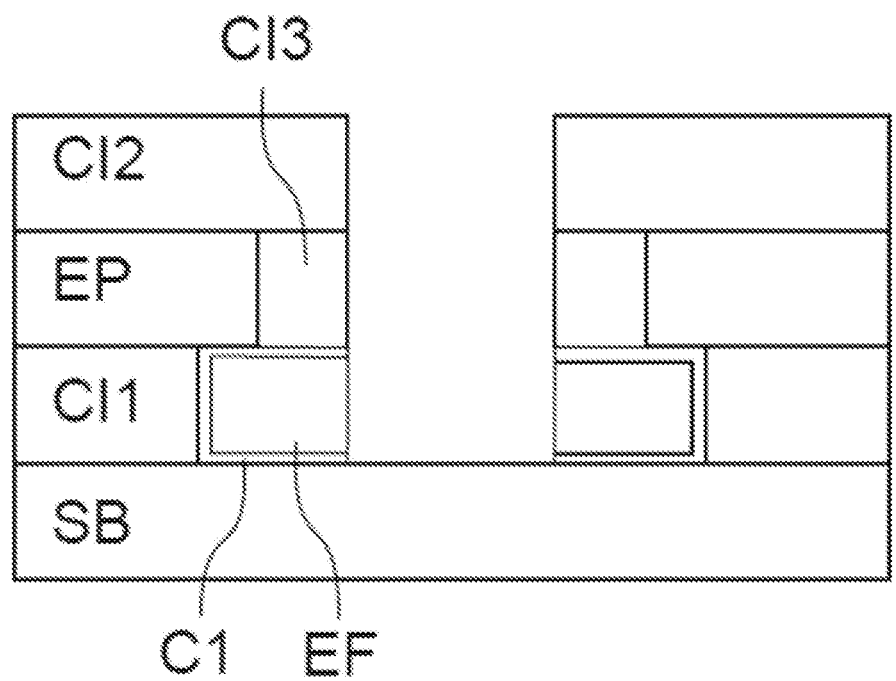

[Figure 4L]
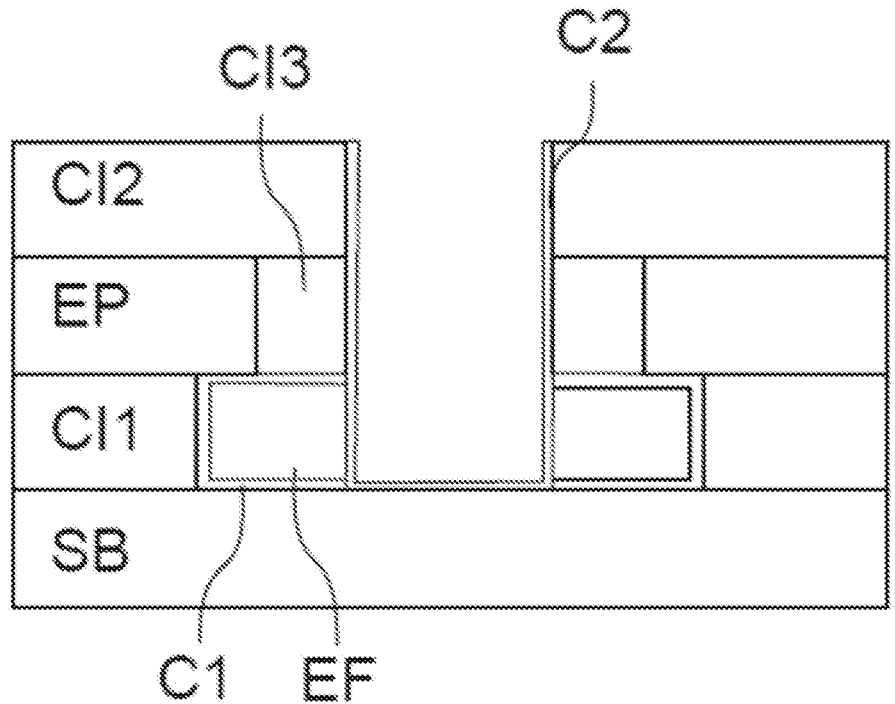
[Figure 4M]
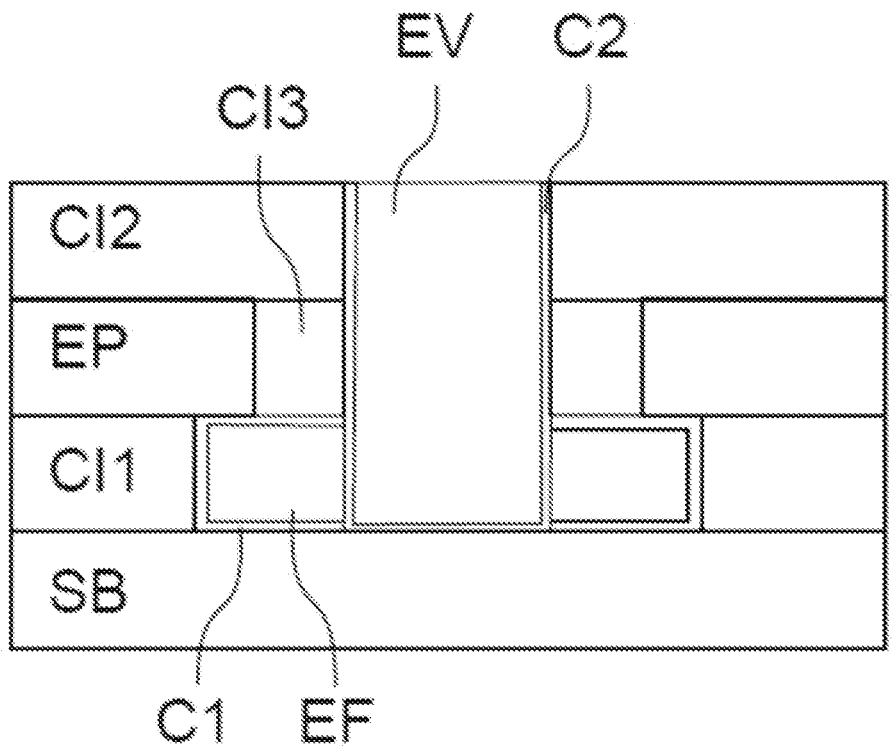

[Figure 5]
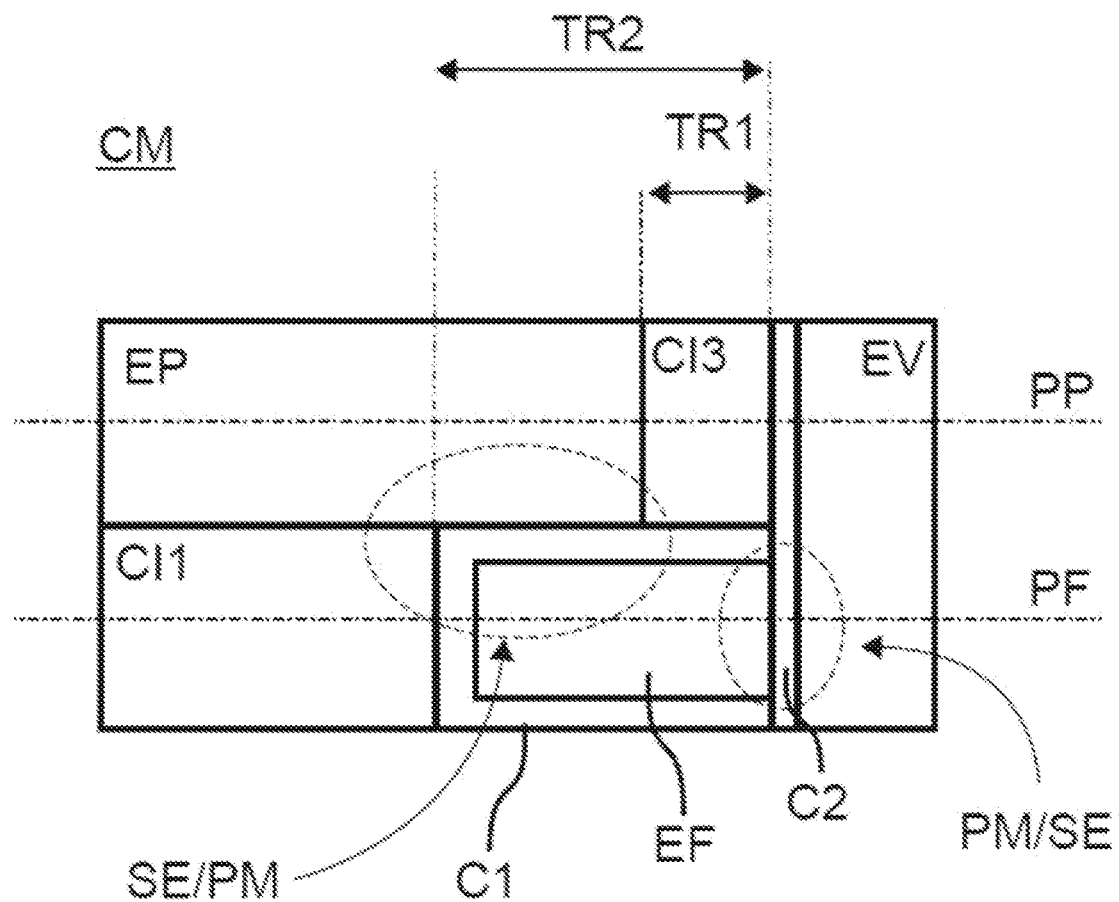

[Figure 6]
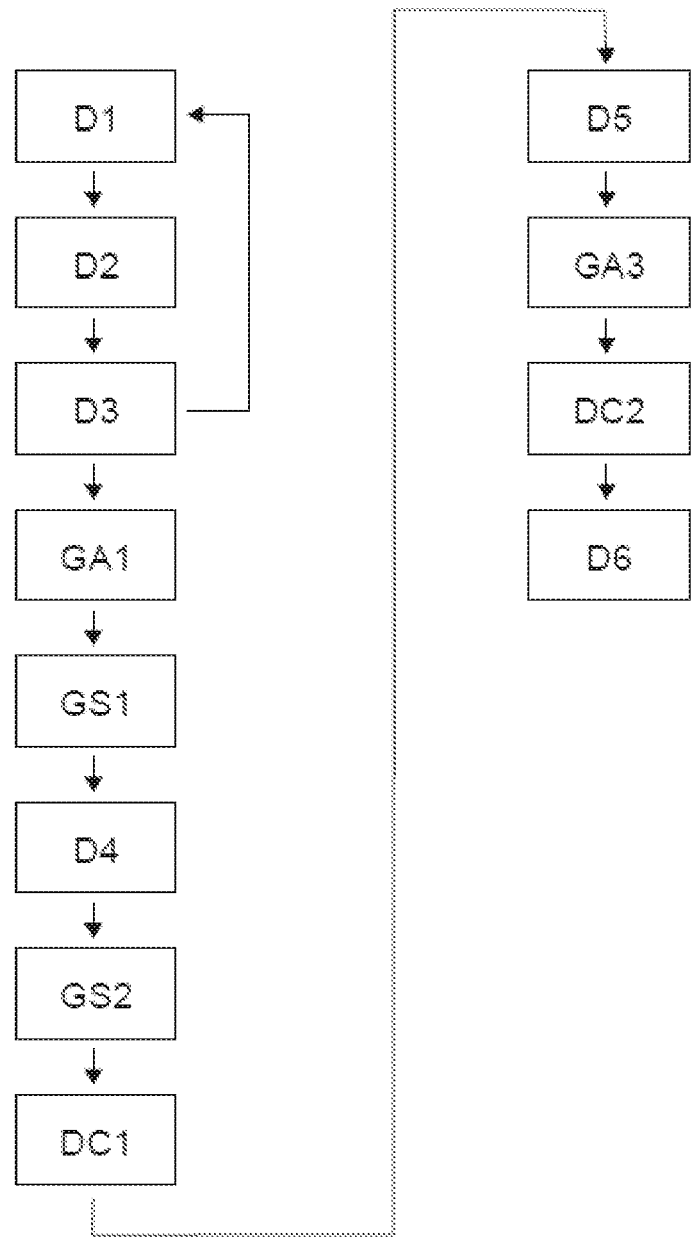

[Figure 7]
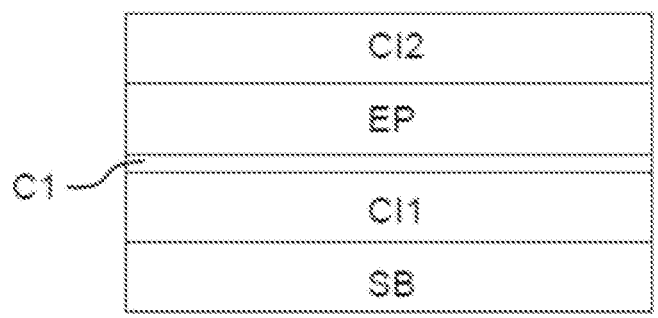
[Figure 8]
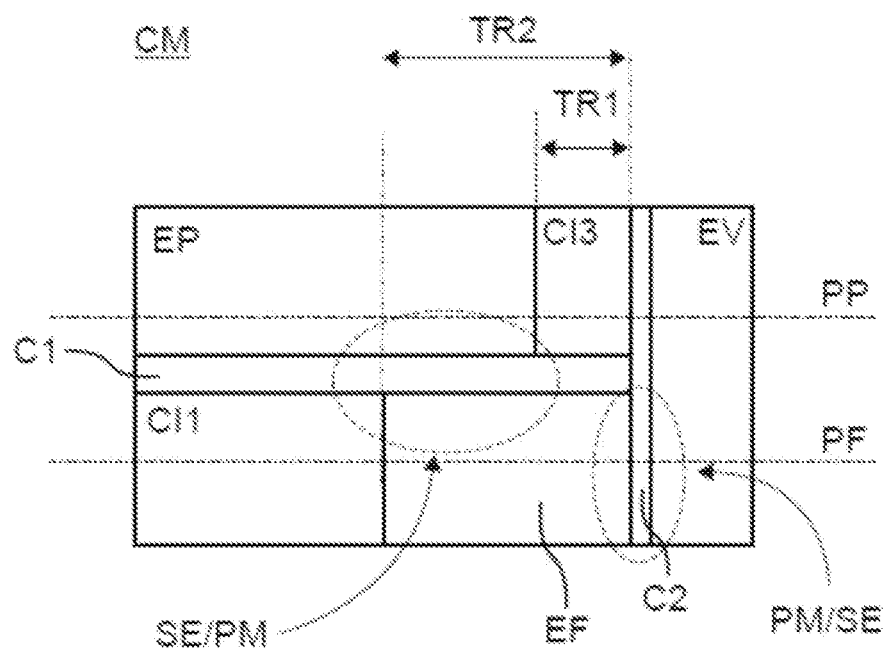

[Figure 9]
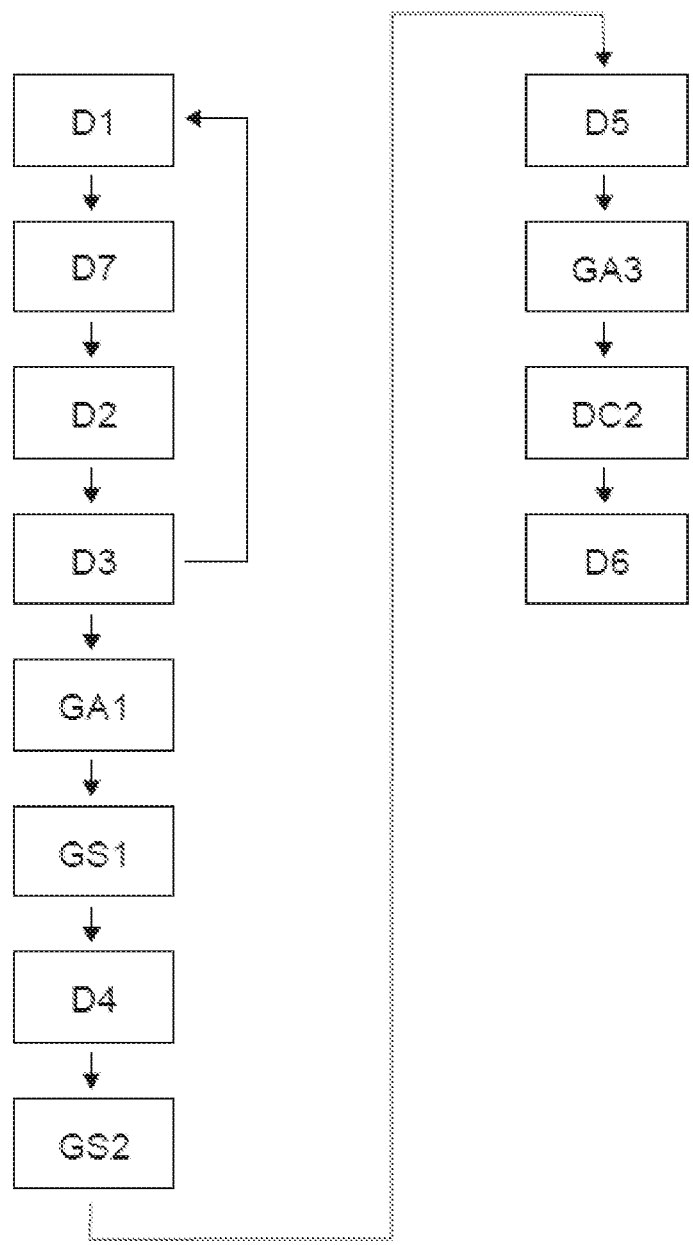

THREE-DIMENSIONAL RESISTIVE RANDOM ACCESS MEMORY AND METHOD MAKING IT POSSIBLE TO OBTAIN SUCH A MEMORY

CROSS-REFERENCE TO RELATED APPLICATIONS

This application is the U.S. National Stage of PCT/EP2019/084813, filed Dec. 12, 2019, which in turn claims priority to French patent application number 1872842 filed Dec. 13, 2018. The content of these applications are incorporated herein by reference in their entirety.

TECHNICAL FIELD OF THE INVENTION

The technical field of the invention is that of memories. The present invention relates to a three-dimensional (hereafter 3D) memory and in particular a 3D memory wherein a selector is associated with each memory point to form a memory cell. The invention also relates to a method making it possible to obtain such a memory.

TECHNOLOGICAL BACKGROUND OF THE INVENTION

In the technology of two-dimensional (hereafter 2D) memories, a known problem linked to the addressing of a memory point PM is that of leakage paths. Indeed, as illustrated in FIG. 1A, when a reading potential is applied to a line and to a column in order to read a memory point PM of a matrix of memory points PM, the current passes not only through the target memory point PM (that is to say situated at the intersection of the selected line and column—solid line arrow), but also through parasitic paths (through memory points PM not addressed in low resistance—broken line arrows) which can alter the reading of the memory point PM.

In 2D structures, it is easy to reduce or even to eliminate the problem of parasitic paths by inserting a selector SE between the memory point PM and the addressing column or line, as illustrated in FIG. 1B. A selector SE is composed of a floating electrode EF (that is to say that it is not connected to any potential reference during the operation of the memory), an active material C1/C2, in general chosen as a function of the active material C2/C1 used for the memory point PM, and an electrode EP/EV. However, such a configuration has not until now been put in place in the case of 3D memories. Indeed, in the case of a 3D memory, the putting in place of a selector SE would lead to a short-circuit between the planar electrodes EP, said short-circuit being caused by the floating electrode EF.

There thus exists a need for a 3D memory comprising selectors SE in order to decrease or eliminate the problem of leakage paths. There also exists a need for a method making it possible to obtain such a memory.

SUMMARY OF THE INVENTION

The invention offers a solution to the aforementioned problems, by proposing a 3D memory device comprising a selector for each memory point. For the record, a 3D memory is the result of an integration strategy where the devices are organised in the three directions of space, and no longer uniquely on a horizontal plane as in traditional 2D memories. This configuration makes it possible to improve the performances of memory devices while increasing storage density (and thus reducing manufacturing costs).

One aspect of the invention relates to a memory, in particular a 3D memory, comprising at least one memory cell, preferably a plurality of memory cells, each memory cell comprising:

a first electrode, referred to as planar electrode, extending essentially along a first plane;

a second electrode, referred to as floating electrode, extending essentially along a second plane, parallel to the first plane;

a third electrode, referred to as vertical electrode, extending essentially along a direction perpendicular to the first plane.

In addition, the planar electrode comprises at least one first part facing a first part of the floating electrode, the first part of the planar electrode and the first part of the floating electrode being separated by a first layer of a first active material. Similarly, the vertical electrode comprises at least one first part facing a second part of the floating electrode, the first part of the vertical electrode and the second part of the floating electrode being separated by a second layer of a second active material. Finally, the first active material is capable of forming a selector or a memory point and the second active material is capable of forming a memory point or a selector. In addition, the first electrode and the second electrode do not share any plane that is parallel to the first plane or to the second plane.

Thanks to the invention, each memory point is associated with a selector which makes it possible to reduce or even to eliminate leakage path problems during the addressing of a memory point. In addition, each memory point is associated with a selector, the geometry of which may be controlled.

Apart from the characteristics that have been described in the preceding paragraph, the memory according to a first aspect of the invention may have one or more characteristics among the following, considered individually or according to all technically possible combinations thereof.

Advantageously, the first layer of a first insulator material is separated from the second layer of a second active material by a second separation distance TR2, the second distance TR2 being chosen as a function of the nature of the first active material.

A second aspect of the invention relates to a method for manufacturing a memory comprising at least one memory cell, said method comprising:

a first step of deposition of a first layer of a first insulator material;

a second step of deposition of a first layer of a conductor material;

a third step of deposition of a second layer of a second insulator material; said first step of deposition of a first layer of a first insulator material, second step of deposition of a first layer of a conductor material and third step of deposition of a second layer of a second insulator material being able to be iterated a plurality of times.

In addition, the method according to a second aspect of the invention also comprises:

a first step of anisotropic etching, so as to create an opening in the first layer of a first insulator material, the first layer of a conductor material and the second layer of a second insulator material;

a first step of selective etching of the first layer of a conductor material so as to form an indent in said first layer of a conductor material;

a step of deposition or growth of a third layer of a third insulator material so as to fill the indent obtained during the first step of selective etching of the first layer of a conductor material;

a second step of selective etching of the first layer of a first insulator material;

a first step of conformal deposition of a first layer of a first active material;

a fifth step of deposition of a second layer of a conductor material;

a third step of anisotropic etching of the first layer of a first active material and the second layer of a conductor material;

a second step of conformal deposition of a second layer of a second active material;

a sixth step of deposition of a third layer of a conductor material;

the first active material being capable of forming a selector or a memory point and the second active material being capable of forming a memory point or a selector.

A third aspect of the invention relates to a method for manufacturing a memory comprising at least one memory cell, said method comprising:

a first step of deposition of a first layer of a first insulator material;

a seventh step of deposition of a first layer of a first active material;

a second step of deposition of a first layer of a conductor material;

a third step of deposition of a second layer of a second insulator material; said first step of deposition of a first layer of a first insulator material, seventh step of deposition of a first layer of a first active material, second step of deposition of a first layer of a conductor material and third step of deposition of a second layer of a second insulator material being able to be iterated a plurality of times.

In addition, the method according to a third aspect of the invention also comprises:

a first step of anisotropic etching, so as to create an opening in the first layer of a first insulator material, the first layer of a first active material, the first layer of a conductor material and the second layer of a second insulator material;

a first step of selective etching of the first layer of a conductor material so as to form an indent in said first layer of a conductor material;

a step of deposition or growth of a third layer of a third insulator material so as to fill the indent obtained during the first step of selective etching of the first layer of a conductor material;

a second step of selective etching of the first layer of a first insulator material;

a fifth step of deposition of a second layer of a conductor material;

a third step of anisotropic etching of the second layer of a conductor material;

a second step of conformal deposition of a second layer of a second active material;

a sixth step of deposition of a third layer of a conductor material; the first active material being capable of forming a selector or a memory point and the second active material being capable of forming a memory point or a selector.

The method according to a second or a third aspect of the invention makes it possible to exert precise control on the geometry of the selector and/or the memory point in a 3D structure notably through the dimensions of the indents obtained during the two selective etching steps.

Apart from the characteristics that have been described in the preceding paragraph, the memory according to a second or a third aspect of the invention may have one or more characteristics among the following, considered individually or according to all technically possible combinations thereof.

Advantageously, when the step of deposition or growth of a third layer of a third insulator material is a deposition step, then said step comprises:

a first sub-step of deposition of a third layer of a third insulator material;

a second sub-step of anisotropic etching of the third layer of a third insulator material.

Advantageously, the step of deposition or growth of a third layer of a third insulator material is a thermal growth step.

Advantageously, the conductor material is selected from TiN, TaN, TaCN, Ta, Ti, W, Cu, Ru, Mo, Co, C, Al and/or Ag, or an alloy comprising at least two of said metals.

Advantageously, when the active material is intended to form a selector, then the latter is selected from VOx, GeSe, TiOx, TaxOy.

Advantageously, when the active material is intended to form a memory point, then the latter is selected from HfOx, AlxOy, TaxOy, CuTeGe, GST, TiOx, SiOx.

The invention and the different applications thereof will be better understood on reading the description that follows and by examining the figures that accompany it.

BRIEF DESCRIPTION OF THE FIGURES

The figures are presented for illustrative purposes and in no way limit the invention.

FIG. 1 shows a schematic representation of a 2D memory device without (FIG. 1A) and with (FIG. 1B) selector.

FIG. 2 shows a schematic representation of a memory according to an embodiment of a first aspect of the invention.

FIG. 3 shows a schematic representation of a memory according to an embodiment of a first aspect of the invention.

FIG. 4 shows a schematic representation of the steps of a method according to an embodiment of a second aspect of the invention.

FIG. 5 shows a schematic representation of a memory cell obtained by means of a method according to a second aspect of the invention.

FIG. 6 shows a logic diagram of a method according to a second aspect of the invention.

FIG. 7 shows a schematic representation of a stack obtained in the course of the implementation of a method according to a third aspect of the invention.

FIG. 8 shows a schematic representation of a memory cell of a memory obtained by means of a method according to a third aspect of the invention.

FIG. 9 shows a logic diagram of a method according to a third aspect of the invention.

DETAILED DESCRIPTION OF AT LEAST ONE EMBODIMENT OF THE INVENTION

Unless stated otherwise, a same element appearing in the different figures has a single reference.

As illustrated in FIG. 2 and in FIG. 3, a first embodiment of a first aspect of the invention relates to a memory ME, in particular a three-dimensional memory, comprising at least one memory cell CM, preferably a plurality of memory cells CM (as illustrated in FIG. 3 where said memory comprises two memory cells). Each memory cell CM comprises a first electrode, referred to as planar electrode EP, extending essentially along a first plane PP, a second electrode, referred to as floating electrode EF, extending essentially along a second plane PF, parallel to the first plane PP and a third electrode, referred to as vertical electrode EV, extending essentially along a direction perpendicular to the first plane PP and to the second plane PF. In addition, the planar electrode EP comprises at least one first part facing a first part of the floating electrode EF at the level of a first region RR1, the first part of the planar electrode EP and the first part of the floating electrode EF being separated by a first layer C1 of a first active material. Similarly, the vertical electrode EV comprises at least one first part facing a second part of the floating electrode EF at the level of a second region RR2, the first part of the vertical electrode EV and the second part of the floating electrode EF being separated by a second layer C2 of a second active material. Finally, the first electrode EP and the second electrode EF do not share any plane that is parallel to the first plane PP or to the second plane PF. In other words, the two electrodes lie in two different planes. The vertical electrode EV is preferably of cylindrical shape, even more preferentially, a right circular cylinder. For the record, a cylinder is a regulated surface of which the generatrixes are parallel. The width (or the diameter for the right circular cylinder) of the vertical electrode EV is limited by the height of said cylinder and the manufacturing methods used. In particular, the maximum shape aspect allowed by a given method will make it possible to know the minimum diameter of the vertical electrode EV as a function of the height of said vertical electrode EV. The conductor materials of the vertical electrode EV, the planar electrode EP and the floating electrode EF may be selected from TiN, TaN, TaCN, Ta, Ti, W, Cu, Ru, Mo, Co, C, Al and/or Ag or alloys thereof.

Furthermore, the first active material C1 is capable of forming a selector SE or a memory point PM and the second active material C2 is capable of forming a memory point PM or a selector SE. Thus, each memory cell CM comprises a selector SE and a memory point PM. The material used to obtain a selector may notably comprise VOx, GeSe, TiOx, TaxOy. The material used to obtain a memory point may notably comprise HfOx, AlxOy, TaxOy, CuTeGe, GST, TiOx, SiOx. For example, the first active material (respectively the second active material) is GeSe whereas the second active material (respectively the first active material) is GST (GeSbTe).

The memory ME thus obtained has numerous advantages. It notably makes it possible to reduce or even to eliminate leakage paths thanks to the presence of a selector SE associated with a memory point PM in each memory cell CM. Hereafter, PM is taken to mean the assembly constituted of two electrodes (for example the planar electrode EP and the floating electrode EF or the floating electrode EF and the vertical electrode EV) surrounding an active material (for example the first layer C1 of a first active material or the second layer C2 of a second active material) capable of forming a memory point PM. Similarly, selector SE is taken to mean the assembly constituted of two electrodes surrounding an active material capable of forming a selector SE. The arrangement of each memory cell CM also makes it possible to modulate through two distances the exchange surface between the floating electrode EF and the planar electrode EP. These two lengths are represented in FIG. 2B.

The first TR1 of these distances is the distance separating the planar electrode EP from the second layer C2 of a second active material. The second TR2 of these distances corresponding to the distance separating the first layer CI1 of a first insulator material from the second layer C2 of a second active material.

A second aspect of the invention relates to a manufacturing method making it possible to obtain a memory ME according to a first aspect of the invention. An embodiment of a second aspect of the invention illustrated in FIG. 4, in FIG. 5 and in FIG. 6 relates to a method for manufacturing a memory ME comprising at least one memory cell CM, preferably a plurality of memory cells CM.

As illustrated in FIG. 4A, the method comprises a first step D1 of deposition of a first layer CI1 of a first insulator material. In an embodiment, the first insulator material is SiN. In an embodiment, the thickness of the first layer CI1 of a first insulator material is comprised between 15 nm and 25 nm, preferably equal to 20 nm. In a more general manner, the thickness of the first layer CI1 of a first insulator material determines the thickness of the floating electrode EF and must thus be chosen as a function of the technical constraints concerning said floating electrode EF. The deposition may be carried out on a substrate SB, for example a silicon substrate SB.

As illustrated in FIG. 4B, the method next comprises a second step D2 of deposition of a first layer EP of a conductor material on the first layer CI1 of a first insulator material. In an embodiment, the conductor material is selected from TiN, TaN, TaCN, Ta, Ti, W, Cu, Ru, Mo, Co, C, Al and/or Ag, or one of the alloys thereof. In an embodiment, the thickness of the first layer EP of a conductor material is comprised between 15 nm and 25 nm, preferably equal to 20 nm.

As illustrated in FIG. 4C, the method next comprises a third step D3 of deposition of a second layer CI2 of a second insulator material on the first layer EP of a conductor material. In an embodiment, the second insulator material is SiOx. In an embodiment, the thickness of the second layer CI2 of a second insulator material is comprised between 15 nm and 25 nm, preferably equal to 20 nm.

When it is wished to manufacture a plurality of memory cells CM, as illustrated in FIG. 3, these first three steps D1, D2, D3 are repeated as many times as the desired number of memory cells CM per vertical electrode EV. In an embodiment, the number of repetitions is comprised between two and sixty four. It will be noted that the first step D1 of deposition of a first layer CI1 of a first insulator material and the third step D3 of deposition of a second layer CI2 of a second insulator material may be permuted between each repetition. For example, in the case of two repetitions of the above three steps, the alternation of layer CI1/EP/CI2 may be followed by an alternation of layer CI2/EP/CI1 so as to obtain the stack CI1/EP/CI2/CI2/EP/CI1.

Once the stack obtained, as illustrated in FIG. 4D, the method according to the invention comprises a first step GA1 of anisotropic etching, so as to create an opening OUV in the first layer CI1 of a first insulator material, the first layer EP of a conductor material and the second layer CI2 of a second insulator material. The opening OUV intended notably to form the vertical electrode EV is preferably of cylindrical shape, even more preferentially, a right circular cylinder. For the record, a cylinder is a regulated surface of which the generatrixes are parallel. The width (or the diameter for the right circular cylinder) of the opening OUV (and thus of the vertical electrode EV) is limited by the height of said cylinder and the manufacturing methods used.

In particular, the maximum shape aspect allowed by a given method will make it possible to know the minimum diameter of the vertical electrode EV as a function of the height of said vertical electrode EV. In an embodiment, the diameter of the opening OUV is comprised between 40 nm and 100 nm. When a plurality of memory cells CM is desired, the etching is carried out so as to create an opening OUV in the plurality of first layers CI1 of a first insulator material, the plurality of first layers EP of a conductor material and the plurality of second layers CI2 of a second insulator material. Similarly, when a plurality of vertical electrodes EV is desired, the first step GA1 of anisotropic etching is carried out so as to create a plurality of openings OUV such as that described previously.

As illustrated in FIG. 4E, the method next comprises a first step GS1 of selective etching of the first layer EP of a conductor material. Selective etching is taken to mean that, during said etching, the etching rate of the first layer EP of a first conductor material is greater than the etching rate of the other layers. This etching is going to make it possible to create an indent RT1 in the lateral surface of the opening OUV at the level of the first layer EP of a first conductor material. This first selective etching makes it possible in particular to choose the importance of this indent RT1 and thus the distance TR1 separating the second layer C2 of a second active material from the planar electrode EP. In an embodiment, the indent RT1 is comprised between 15 nm and 25 nm, preferably 20 nm.

As illustrated in FIG. 4F, the method according to the invention comprises a fourth step D4 of deposition or growth of a third layer CI3 of a third insulator material. During this step, the material is deposited in sufficient quantity to fill the indent RT1 made during the preceding step GS1 of selective etching of the first layer EP of a conductor material. In an embodiment, the third insulator material is SiOx. In an embodiment, the step D4 of deposition or growth of a third layer CI3 of a third insulator material is carried out by thermal growth so as to fill the indent produced during step GS1 of selective etching of the first layer EP of a conductor material.

At the end of this step, as illustrated in FIG. 4G, the method comprises a second step GA2 of anisotropic etching of the third layer CI3 of a third insulator material, such that only the part of the third layer CI3 of a third insulator material situated in the indent RT1 created during step GS1 of selective etching of the first layer EP of a conductor material is conserved. When step D4 of deposition or growth of a third layer CI3 of a third insulator material is carried out by thermal growth, then the second step GA2 of anisotropic etching of the third layer CI3 of a third insulator material is not implemented, the growth being stopped when the indent RT1 produced during step GS1 of selective etching of the first layer EP of a conductor material is filled.

As illustrated in FIG. 4H, the method next comprises a second step GS2 of selective etching of the first layer CI1 of a first insulator material. This etching is going to make it possible to create an indent RT2 in the lateral surface of the opening OUV at the level of the first layer CI1 of a first insulator material. This second selective etching makes it possible in particular to choose the importance of this indent RT2 and thus the distance TR2 separating the second layer C2 of a second active material from the first layer CI1 of a first insulator material. In an embodiment, the indent is comprised between 25 nm and 35 nm, preferably 30 nm.

As illustrated in FIG. 4I, the method also comprises a first step DC1 of conformal deposition of a first layer C1 of a first active material. In an embodiment, when the first active material is intended to form a selector SE, then the latter is selected from VOx, GeSe, TiOx, TaxOy. In an embodiment, when the first active material is intended to form a memory point PM, then the latter is selected from HfOx, AlxOy, TaxOy, CuTeGe, GST, TiOx, SiOx. In an embodiment, the thickness of the first layer C1 of a first active material is comprised between 5 nm and 10 nm.

Then, as illustrated in FIG. 4J, the method comprises a fifth step D5 of deposition of a second layer EF' of a conductor material. During this step, the material is deposited in sufficient quantity to fill the indent RT2 made during the preceding step GS2 of selective etching of the first layer CI1 of a first insulator material. In an embodiment, the conductor material is selected from TiN, TaN, TaCN, Ta, Ti, W, Cu, Ru, Mo, Co, C, Al and/or Ag, or one of the alloys thereof.

Next, as illustrated in FIG. 4K, the method comprises a third step GA3 of anisotropic etching of the first layer C1 of a first active material and the second layer EF' of a conductor material, such that only the part of the first layer C1 of a first active material and the second layer EF' of a conductor material situated in the indent RT2 created during step GS2 of selective etching of the first layer CI1 of a first insulator material is conserved.

As illustrated in FIG. 4L, the method also comprises a second step DC2 of conformal deposition of a second layer C2 of a second active material. In an embodiment, when the second active material is intended to form a selector SE, then the latter is selected from VOx, GeSe, TiOx, TaxOy. In an embodiment, when the second active material is intended to form a memory point PM, then the latter is selected from HfOx, AlxOy, TaxOy, CuTeGe, GST, TiOx, SiOx. In an embodiment, the thickness of the second layer C2 of a second active material is comprised between 5 nm and 30 nm. It is important to note here that when the first active material is capable of forming a selector SE (respectively a memory point PM) then the second active material is capable of forming a memory point PM (respectively a selector SE).

As illustrated in FIG. 4M, the method finally comprises a sixth step D6 of deposition of a third layer EV of a conductor material so as to fill the opening OUV. In an embodiment, the conductor material is selected from TiN, TaN, TaCN, Ta, Ti, W, Cu, Ru, Mo, Co, C, Al and/or Ag, or one of the alloys thereof. The memory cell CM obtained at the end of the method is represented in FIG. 5. As indicated in this figure, the memory cell CM comprises a memory point PM and a selector SE, the position of the latter being a function of the materials chosen for the first active material and for the second active material.

As illustrated in FIG. 7, in FIG. 8 and in FIG. 9, a third aspect of the invention relates to an alternative method for manufacturing a memory ME according to a first aspect of the invention. The method comprises a first step D1 of deposition of a first layer CI1 of a first insulator material; a seventh step D7 of deposition of a first layer C1 of a first active material; a second step D2 of deposition of a first layer EP of a conductor material; a third step D3 of deposition of a second layer CI2 of a second insulator material, so as to obtain the stack of FIG. 7. It thus differs from the method according to a second aspect of the invention by the presence of a seventh step D7 of deposition of a first layer C1 of a first active material. As in the method according to the second aspect of the invention, the four steps described above may be repeated as a function of the desired number of memory cells CM. The method according to a third aspect of the invention also differs from the method according to a second aspect of the invention in that it does not comprise a first step DC1 of conformal deposition of a first layer C1 of a first active material, said active material being already present through the implementation of the seventh step D7 of deposition of a first layer C1 of a first active material. The other steps remain for their part unchanged. The method according to a third aspect of the invention makes it possible to obtain a memory cell CM such as represented in FIG. 8. As indicated in this figure, the memory cell comprises a memory point PM and a selector SE, the position of the latter being a function of the materials chosen for the first active material and for the second active material.

In an embodiment, the indent RT2 created during step GS2 of selective etching of the first layer CI1 of a first insulator material is much greater than the indent RT1 created during step GS1 of selective etching of the first layer EP of a conductor material so as to have a large surface of the planar electrode EP facing the floating electrode EF (for example, the difference between the indent RT2 created during step GS2 of selective etching of the first layer CI1 and the indent RT1 created during step GS1 of selective etching of the first layer EP is greater than 10 nm and less than or equal to 100 nm, that is to say 10 nm<TR2−TR1≤100 nm). In this embodiment, the first active material is chosen so as to obtain a selector SE and the second active material is chosen so as to obtain a memory point PM. The selector SE thus obtained may draw advantage from the large facing surface described previously.

In an alternative embodiment, the indent RT2 created during step GS2 of selective etching of the first layer CI1 of a first insulator material is slightly greater than the indent RTI created during step GS1 of selective etching of the first layer EP of a conductor material (for example, the difference between the indent RT2 created during step GS2 of selective etching of the first layer CI1 and the indent RT1 created during step GS1 of selective etching of the first layer EP is less than or equal to 10 nm, that is to say TR2−TR1≤10 nm) so as to have a small surface of the planar electrode EP facing the floating electrode EF. In this embodiment, the first active material is chosen so as to obtain a memory point PM and the second active material is chosen so as to obtain a selector SE. The memory point PM thus obtained occupies a very small surface which makes it possible to increase the storage density of a memory ME using such a memory point PM.

In an embodiment, the memory ME obtained is such that the planar electrode EP is separated from the second layer C2 of a second active material by a first separation distance TR1 and the first layer CI1 of a first insulator material is separated from the second layer C2 of a second active material. In addition, the second distance TR2 is chosen as a function of the nature of the second active material. It will be noted that the second distance TR2 is such that TR2>TR1+$T_{C1}$ with $T_{C1}$ the thickness of the first layer C1 of a first active material. This relationship simply translates the fact that the floating electrode EF indeed has a part facing the planar electrode EP.

The invention claimed is:

1. A memory comprising at least one memory cell, each memory cell comprising:
    a first electrode, forming a planar electrode, extending essentially along a first plane;
    a second electrode, forming a floating electrode, extending essentially along a second plane, parallel to the first plane;
    a third electrode, forming a vertical electrode, extending essentially along a direction perpendicular to the first plane;
    the planar electrode comprising at least one first part facing a first part of the floating electrode, the first part of the planar electrode and the first part of the floating electrode being separated by a first layer of a first active material, the vertical electrode comprising at least one first part facing a second part of the floating electrode, the first part of the vertical electrode and the second part of the floating electrode being separated by a second layer of a second active material, the first active material being adapted to form a selector or a memory point and the second active material being adapted to form a memory point or a selector, the first electrode and the second electrode not sharing any plane that is parallel to the first plane or to the second plane.

2. The memory according to claim 1, wherein a first layer of a first insulator material is separated from the second layer of a second active material by a second separation distance, the second separation distance being chosen as a function of the nature of the active material.

3. A method for manufacturing a memory comprising at least one memory cell, said method comprising:
    a first step of deposition of a first layer of a first insulator material;
    a second step of deposition of a first layer of a conductor material;
    a third step of deposition of a second layer of a second insulator material;
    said first step of deposition of a first layer of a first insulator material, second step of deposition of a first layer of a conductor material and third step of deposition of a second layer of a second insulator material being able to be iterated a plurality of times; the method also comprising:
    a first step of anisotropic etching, so as to create an opening in the first layer of a first insulator material, the first layer of a conductor material and the second layer of a second insulator material;
    a first step of selective etching of the first layer of a conductor material so as to form an indent in said first layer of a conductor material;
    a step of deposition or growth of a third layer of a third insulator material so as to fill the indent obtained during the first step of selective etching of the first layer of a conductor material;
    a second step of selective etching of the first layer of a first insulator material;
    a first step of conformal deposition of a first layer of a first active material;
    a fifth step of deposition of a second layer of a conductor material;
    a third step of anisotropic etching of the first layer of a first active material and the second layer of a conductor material;
    a second step of conformal deposition of a second layer of a second active material;
    a sixth step of deposition of a third layer of a conductor material;
    the first active material being adapted to form a selector or a memory point and the second active material being adapted to form a memory point or a selector.

4. A method for manufacturing a memory comprising at least one memory cell, said method comprising:
    a first step of deposition of a first layer of a first insulator material;

a seventh step of deposition of a first layer of a first active material;

a second step of deposition of a first layer of a conductor material;

a third step of deposition of a second layer of a second insulator material;

said first step of deposition of a first layer of a first insulator material, seventh step of deposition of a first layer of a first active material, second step of deposition of a first layer of a conductor material and third step of deposition of a second layer of a second insulator material being able to be iterated a plurality of times;

the method also comprising:

a first step of anisotropic etching, so as to create an opening in the first layer of a first insulator material, the first layer of a first active material, the first layers of a conductor material and the second layer of a second insulator material;

a first step of selective etching of the first layer of a conductor material so as to form an indent in said first layer of a conductor material;

a step of deposition or growth of a third layer of a third insulator material so as to fill the indent obtained during the first step of selective etching of the first layer of a conductor material;

a second step of selective etching of the first layer of a first insulator material;

a fifth step of deposition of a second layer of a conductor material;

a third step of anisotropic etching of the second layer of a conductor material;

a second step of conformal deposition of a second layer of a second active material;

a sixth step of deposition of a third layer of a conductor material;

the first active material being adapted to form a selector or a memory point and the second active material being adapted to form a memory point or a selector.

5. The method according to claim 3 wherein, when the step of deposition or growth of a third layer of a third insulator material is a deposition step, then the deposition step comprises:

a first sub-step of deposition of a third layer of a third insulator material;

a second sub-step of anisotropic etching of the third layer of a third insulator material.

6. The method according to claim 3 wherein the step of deposition or growth of a third layer of a third insulator material is a thermal growth step.

7. The method according to claim 3, wherein the conductor material is selected from TiN, TaN, TaCN, Ta, Ti, W, Cu, Ru, Mo, Co, C, Al and/or Ag, or an alloy comprising at least two of said metals.

8. The method according to claim 3, wherein, when the active material forms a selector, then the active material is selected from VOx, GeSe, TiOx, TaxOy.

9. The method according to claim 3, wherein, when the active material forms a memory point, then the active material is selected from HfOx, AlxOy, TaxOy, CuTeGe, GST, TiOx, SiOx.

* * * * *